(12) United States Patent
Matsubara et al.

(10) Patent No.: US 11,282,736 B2
(45) Date of Patent: Mar. 22, 2022

(54) MASK-INTEGRATED SURFACE PROTECTIVE TAPE WITH RELEASE LINER

(71) Applicant: FURUKAWA ELECTRIC CO., LTD., Tokyo (JP)

(72) Inventors: Yukihiro Matsubara, Tokyo (JP); Hirotoki Yokoi, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/584,422

(22) Filed: Sep. 26, 2019

(65) Prior Publication Data

US 2020/0017728 A1 Jan. 16, 2020

Related U.S. Application Data

(63) Continuation of application No. PCT/JP2018/012764, filed on Mar. 28, 2018.

(30) Foreign Application Priority Data

Mar. 31, 2017 (JP) .............................. JP2017-071253

(51) Int. Cl.
*C09J 7/40* (2018.01)
*H01L 21/683* (2006.01)
(Continued)

(52) U.S. Cl.
CPC .... *H01L 21/6836* (2013.01); *C08F 220/1808* (2020.02); *C09J 7/20* (2018.01);
(Continued)

(58) Field of Classification Search
None
See application file for complete search history.

(56) References Cited

U.S. PATENT DOCUMENTS 6,007,920 A 12/1999 Umehara
10,307,866 B2 * 6/2019 Yokoi ................... H01L 21/304
(Continued)

FOREIGN PATENT DOCUMENTS

JP 2002-201442 A 7/2002
JP 2006-49482 A 2/2006
(Continued)

OTHER PUBLICATIONS

Arahashi, Tomomi et al., "Adhesive Tape For Protecting Semiconductor Wafer Surface, And Processing Method of Semiconductor Wafer", machine translation of JP 2014-192204A, Jun. 10, 2014 (Year: 2014).*

(Continued)

*Primary Examiner* — Anish P Desai
(74) *Attorney, Agent, or Firm* — Birch, Stewart, Kolasch & Birch, LLP

(57) ABSTRACT

A mask-integrated surface protective tape with a release liner, containing: a base film, a temporary-adhesive layer, a release film, a mask material layer, and a release liner, in this order,
  wherein the release film and the release liner each have one release-treated surface, and the release-treated surfaces of the release film and the release liner each are in contact with the mask material layer, and
  wherein the peeling strength between the release liner and the mask material layer is smaller than the peeling strength between the release film and the mask material layer.

11 Claims, 7 Drawing Sheets

(51) Int. Cl.
  *C09J 7/20* (2018.01)
  *H01L 21/304* (2006.01)
  *H01L 21/67* (2006.01)
  *H01L 23/00* (2006.01)
  *C08F 220/18* (2006.01)
(52) U.S. Cl.
  CPC .............. *C09J 7/40* (2018.01); *H01L 21/304* (2013.01); *H01L 21/67132* (2013.01); *H01L 24/50* (2013.01); *H01L 24/79* (2013.01); *H01L 24/86* (2013.01); *Y10T 428/14* (2015.01); *Y10T 428/1476* (2015.01); *Y10T 428/2809* (2015.01); *Y10T 428/2848* (2015.01); *Y10T 428/2891* (2015.01)

(56) References Cited

U.S. PATENT DOCUMENTS

| | | | |
|---|---|---|---|
| 10,916,439 B2 * | 2/2021 | Yokoi | H01L 21/6836 |
| 10,916,441 B2 * | 2/2021 | Uchiyama | H01L 21/31133 |
| 2003/0077442 A1 | 4/2003 | Inokuchi et al. | |
| 2006/0154066 A1 * | 7/2006 | Kita | H01L 24/29 428/401 |
| 2007/0141330 A1 * | 6/2007 | Morishima | C09J 7/20 428/343 |
| 2008/0008881 A1 * | 1/2008 | Yabuki | H01L 21/6835 428/343 |
| 2010/0048001 A1 * | 2/2010 | Harikai | H01J 37/32743 438/464 |
| 2010/0279491 A1 | 11/2010 | Kiuchi et al. | |
| 2017/0069522 A1 * | 3/2017 | Hiroshima | H01L 21/304 |
| 2018/0012787 A1 | 1/2018 | Oka et al. | |

FOREIGN PATENT DOCUMENTS

| | | | |
|---|---|---|---|
| JP | 2007-19385 A | | 1/2007 |
| JP | 2014192204 A | * | 10/2014 |
| JP | 2016-164953 A | | 9/2016 |
| JP | 2016-171263 A | | 9/2016 |
| KR | 10-2017-0004301 A | | 8/2017 |

OTHER PUBLICATIONS

Yoshifumi Oka et al., "Processing Method for a Semiconductor Wafer and Surface Protective Tape for Processing Semiconductor Chips and Semiconductor Wafers", English translation of JP2016-171263 A, Sep. 23, 2016 (Year: 2016).*
Tomomi, Arahashi et al., "Adhesive Tape for Protecting Semiconductor Wafer Surfaces and Method for Processing Semiconductor Wafers", English translation of JP 2014192204A, Oct. 6, 2014 (Year: 2014).*
Korean Office Action for corresponding Korean Application No. 10-2019-7022149, dated Dec. 9, 2020, with English translation.
International Search Report, issued in PCT/JP2018/012764, dated Jun. 19, 2018.
Taiwanese Office Action, issued in Application No. 107111134, dated Apr. 29, 2019.
Extended European Search Report dated Oct. 19, 2020 for corresponding Application No. 18775865.1.
Korean Notice of Final Rejection for corresponding Korean Application No. 10-2019-7022149, dated May 4, 2021, with an English translation.

* cited by examiner (a)

(b)

(c)

MASK-INTEGRATED SURFACE PROTECTIVE TAPE WITH RELEASE LINER

CROSS-REFERENCE TO RELATED APPLICATIONS

This application is a Continuation of PCT International Application No. PCT/JP2018/012764 filed on Mar. 28, 2018, which claims priority under 35 U.S.C. § 119 (a) to Japanese Patent Application No. 2017-071253 filed in Japan on Mar. 31, 2017. Each of the above applications is hereby expressly incorporated by reference, in its entirety, into the present application.

TECHNICAL FIELD

The present invention relates to a mask-integrated surface protective tape with a release liner.

BACKGROUND ART

In recent years, remarkable evolution has made on the thinning of the semiconductor chip and the downsizing of the chip. In particular, the thinning is required in the IC cards with built-in semiconductor IC chips, such as a memory card and a smart card. Further, the downsizing of the chip is required in LED or LCD driving devices and the like. With the increase in demands for the IC cards and the LED and/or LCD driving devices from now on, the needs for the thinning of the semiconductor chip and the downsizing of the chip are expected to increase further.

The semiconductor chip is obtained by thinning a semiconductor wafer to a predetermined thickness in the backgrinding step and the etching step, and then dividing the thinned semiconductor wafer into individual chips through the dicing step. In the dicing step, use is made of various methods, such as a blade dicing method of performing the dicing with a dicing blade; a laser dicing method of performing the dicing with laser; a water-jet method of performing the dicing with a water pressure; a stealth dicing method of forming a modified layer with laser in the thickness direction of the semiconductor wafer, and then segmenting the modified layer by expansion whereby singulation is performed; and a plasma dicing method of performing the dicing with plasma (see, for example, Patent Literature 1).

Among these, the plasma dicing method is considered one of the most suitable processes for the segmentation into chips. The plasma dicing method is a method of dividing a semiconductor wafer, by selectively etching a portion not covered with a mask, using plasma. When this dicing method is used, segmentation of chips can be achieved selectively, and even if the scribe line is curved, the segmentation is possible with no trouble. Further, the etching rate of the semiconductor wafer is very high.

CITATION LIST

Patent Literatures

Patent Literature 1: JP-A-2007-19385 ("JP-A" means unexamined published Japanese patent application)

SUMMARY OF INVENTION

Technical Problem

In the plasma dicing method, use is made of, as a plasma generating gas, a fluorine-based gas which has a very high reactivity with a wafer, such as sulfur hexafluoride ($SF_6$) and carbon tetrafluoride ($CF_4$). For this reason, a protection for a non-etching surface with a mask against such high etching rate is necessary. Therefore, a preliminary mask formation becomes necessary.

In order to form the mask, as described in Patent Literature 1, generally the technique is used which consists of: coating a resist on the surface of the wafer; and then removing the portion corresponding to a street by a photolithography, to form the mask. Therefore, in order to carry out the plasma dicing, it is required for a facility for the photolithographic step in addition to the plasma dicing facility. For this reason, there is a problem of increase in chip costs. Further, because of being in a state that a mask (resist film) is remaining after the plasma-etching, it is necessarily to use a large amount of solvent to remove the mask. Nevertheless, the removal of the mask is not always completely performed, which sometimes resulted in occurrence of defective chips. Further, there is also a disadvantage that an overall processing process gets longer period, because of undergoing a masking step with a resist.

For the mask-integrated surface protective tape with a release liner, in the backgrinding step of the semiconductor wafer, it is important to protect a patterned face of the semiconductor wafer, and before the subsequent singulation step with plasma, it is also important to selectively leave a mask material layer from the mask-integrated surface protective tape on the semiconductor wafer.

Further, in order to selectively expose a necessary layer in each step, the relationship of peeling strength between each of layers needs to be properly controlled. Therefore, there are significant limitations in design of the each of layers.

The present invention is contemplated to provide a mask-integrated surface protective tape with a release liner, which eliminates the need for mask formation by a photolithography process in production of the semiconductor chip.

The present invention is further contemplated to provide a mask-integrated surface protective tape, in which the relationship of peeling strength between each of layers is controlled, whereby a mask material layer can be exposed while maintaining its surface condition.

Solution to Problem

The above-described problems of the present invention are solved by the following means.
(1) A mask-integrated surface protective tape with a release liner, containing, in the following order:
 a base film,
 a temporary-adhesive layer,
 a release film,
 a mask material layer, and
 a release liner,
 wherein the release film and the release liner each have one release-treated surface, and the release-treated surfaces of the release film and the release liner each are in contact with the mask material layer, and
 wherein the peeling strength between the release liner and the mask material layer is smaller than the peeling strength between the release film and the mask material layer.
(2) The mask-integrated surface protective tape with a release liner as described in the item (1), wherein the storage elastic modulus of the mask material layer is less than 100,000 Pa.
(3) The mask-integrated surface protective tape with a release liner as described in the item (1) or (2), wherein the peeling strength between the release film and the mask material layer is 0.02 N/25 mm or more and less than 1.0 N/25 mm.

(4) The mask-integrated surface protective tape with a release liner as described in any one of the items (1) to (3), wherein the tensile elastic modulus of a laminate obtained by removing the release liner from the mask-integrated surface protective tape with a release liner, is 1 GPa or more.

(5) The mask-integrated surface protective tape with a release liner as described in any one of the items (1) to (4), wherein the tensile elastic modulus of the release film is 1.5 GPa or more.

(6) The mask-integrated surface protective tape with a release liner as described in any one of the items (1) to (5), wherein the thickness of the release film is from 25 μm to 75 μm.

(7) The mask-integrated surface protective tape with a release liner as described in any one of the items (1) to (6), wherein a material of the base film on the side opposite to the temporary-adhesive layer is a low-density polyethylene or an ethylene-vinyl acetate copolymer.

(8) The mask-integrated surface protective tape with a release liner as described in any one of the items (1) to (7), wherein a mask material of the mask material layer is ultraviolet-curable.

(9) The mask-integrated surface protective tape with a release liner as described in any one of the items (1) to (8), which is for use in a production of a semiconductor chip including the following steps (a) to (d):

(a) a step of peeling the release liner from the mask-integrated surface protective tape with a release liner, to form a mask-integrated surface protective tape, and then in the state where the mask-integrated surface protective tape has been laminated on a patterned face of a semiconductor wafer, grinding a backing-face of the semiconductor wafer, and then laminating a wafer-fixing tape on the backing-face of the ground semiconductor wafer, and then supporting and fixing the semiconductor wafer with a ring flame;

(b) a step of peeling together the base film, the temporary-adhesive layer and the release film from the mask-integrated surface protective tape, thereby to expose the mask material layer on top, and then cutting a portion of the mask material layer corresponding to a street of the semiconductor wafer by a laser, thereby to open the street of the semiconductor wafer;

(c) a plasma-dicing step of segmentalizing the semiconductor wafer on the street by a $SF_6$ plasma, and thereby for singulating the semiconductor wafer into semiconductor chips; and (d) an ashing step of removing the mask material layer by an $O_2$ plasma.

(10) The mask-integrated surface protective tape with a release liner as described in the item (9), wherein the thickness of the mask material layer is larger than a maximum height of the asperity of the patterned face.

(11) The mask-integrated surface protective tape with a release liner as described in the item (9) or (10), wherein the maximum height of the asperity of the patterned surface is 50 μm or more.

Effects of Invention

The mask-integrated surface protective tape with a release liner according to the present invention allows mask formation without a photolithography process in production of the semiconductor chip using a plasma dicing method. Further, in the mask-integrated surface protective tape with a release liner according to the present invention, peeling of the release liner enables a mask material layer to expose on top of the surface protective tape. Further, in the mask-integrated surface protective tape with a release liner according to the present invention, the mask material layer can be exposed on top of the semiconductor wafer while maintaining its surface condition after the above-described thinning step.

Other and further features and advantages of the invention will appear more fully from the following description, appropriately referring to the accompanying drawings.

BRIEF DESCRIPTION OF THE DRAWINGS

FIG. 2(a) shows a semiconductor wafer, fragmentary FIG. 2(b) shows how the mask-integrated surface protective tape is laminated onto the semiconductor wafer, and fragmentary FIG. 2(c) shows a semiconductor wafer on which the mask-integrated surface protective tape is laminated.

FIG. 3(a) shows thinning step of the semiconductor wafer, fragmentary FIG. 3(b) shows how a wafer-fixing tape is laminated to the thinning processed semiconductor wafer, and fragmentary FIG. 3(c) shows a state in which the semiconductor wafer is fixed to a ring flame.

FIG. 4(a) shows how the laminate composed of the base film, the temporary-adhesive layer, and the release film is peeled off from the mask-integrated surface protective tape while leaving the mask material layer; fragmentary FIG. 4(b) shows a state in which the mask material layer of the mask-integrated surface protective tape is exposed (uncovered), and fragmentary FIG. 4(c) shows a step of cutting off the mask material layer corresponding to the street with a laser.

FIG. 5(a) shows how the plasma dicing is carried out, fragmentary FIG. 5(b) shows a state in which the semiconductor wafer is singulated into chips, and fragmentary FIG. 5(c) shows how the plasma ashing is carried out.

FIG. 6(a) shows a state, in which the mask material layer is removed, and fragmentary FIG. 6(b) shows how the chip is picked up.

FIG. 7(a) shows a state in which both sides of the front and the back of the semiconductor wafer are covered and fixed with the mask-integrated surface protective tape and the wafer-fixing tape, respectively. Fragmentary FIG. 7(b) shows how an ultraviolet light is irradiated. Fragmentary FIG. 7(c) shows how the laminate composed of the base film, the temporary-adhesive layer, and the release film is peeled off from the mask-integrated surface protective tape while leaving the mask material layer.

MODE FOR CARRYING OUT THE INVENTION

Figure 1:
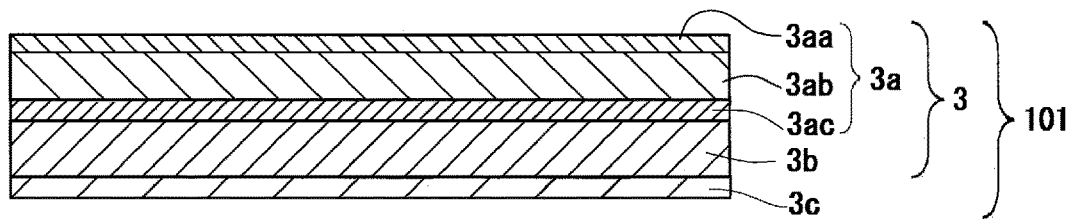
FIG. 1 is a schematic cross-sectional view showing one embodiment of the mask-integrated surface protective tape with a release liner according to the present invention.

The mask-integrated surface protective tape with a release liner of the present invention is preferably used for the method of obtaining a semiconductor chip by dividing and singulating a semiconductor wafer with a plasma dicing. More minutely, in order to protect a patterned face (it is a surface on which a circuit, a device and/or a bump has or have been formed) in backgrinding the semiconductor wafer, the mask-integrated surface protective tape with a release liner according to the present invention is preferably laminated on the patterned face and used.

As described below, by using the mask-integrated surface protective tape with a release liner of the present invention, a photolithography process prior to the plasma dicing step becomes unnecessary, whereby production costs of the semiconductor chips and the semiconductor products can be largely suppressed.

The mask-integrated surface protective tape with a release liner of the present invention is more preferably used in a production of a semiconductor chip, containing at least the following steps (a) to (d):

(a) a step of peeling the release liner from the mask-integrated surface protective tape with a release liner of the present invention, to form a mask-integrated surface protective tape, and then in the state where the mask-integrated surface protective tape has been laminated on the patterned face of the semiconductor wafer, grinding a backing-face of the semiconductor wafer, and then laminating a wafer-fixing tape on the backing-face of the ground semiconductor wafer, and then supporting and fixing the semiconductor wafer with a ring flame;

(b) a step of peeling together the base film, the temporary-adhesive layer and the release film from the mask-integrated surface protective tape (that is, peeling a laminate composed of the base film, the temporary-adhesive and the release film from the mask-integrated surface protective tape), thereby to expose the mask material layer on top, and then cutting a portion of the mask material layer corresponding to a street of the semiconductor wafer by a laser, thereby to open the street of the semiconductor wafer;

(c) a plasma-dicing step of segmentalizing the semiconductor wafer at the street with $SF_6$ plasma, and thereby for singulating the semiconductor wafer into semiconductor chips; and (d) an ashing step of removing the mask material layer with $O_2$ plasma.

The method of producing a semiconductor chip in which the mask-integrated surface protective tape with a release liner of the present invention is employed, preferably includes the following step (e), after the step (d). When the production method includes following step (e), the method preferably includes the following step (f) after the step (e).

(e) A step of picking up the semiconductor chip from the wafer-fixing tape, (f) A step of transiting the picked-up semiconductor chip to a die bonding step.

The mask-integrated surface protective tape with a release liner according to the present invention has a base film, a temporary-adhesive layer, a release film, a mask material layer, and a release liner in this order.

In the present invention, a laminate composed of the above-described base film, the above-described temporary-adhesive layer, the above-describe release film, and the above-describe mask material layer is sometimes referred to as "a mask-integrated surface protective tape".

Further, a laminate composed of the above-described base film and the above-described temporary-adhesive layer is sometimes referred to as "a surface protective tape". In other words, the mask-integrated surface protective tape with a release liner according to the present invention is a tape having a multilayer structure in which the release film, the mask material layer, and the release liner have been provided on the temporary-adhesive layer of the surface protective tape.

In the mask-integrated surface protective tape with a release liner according to the present invention, at least a mask material is preferably pressure-sensitive, more preferably the mask material is pressure-sensitive and radiation-curable (that is, has a property of curing by radiation exposure), and still more preferably the mask material is radiation-curable and a temporary-adhesive is pressure-sensitive. The temporary-adhesive may be pressure-sensitive and radiation-curable.

In a case where the mask material is radiation-curable, a step (ab) of curing the mask material by radiation exposure to the mask-integrated surface protective tape is preferably incorporated between the above-described step (a) and the above-described step (b). If the mask material is cured by radiation exposure thereby to form a cured mask material layer, an interlayer peeling strength between the cured mask material layer and the release film is lowered, so that peeling of the laminate composed of the base film, the temporary-adhesive layer and the release film from the mask material layer becomes easier.

In the present invention, the temporary-adhesive layer means a coating layer of a temporary-adhesive composition, and is in the state in which a temporary-adhesive contained in the temporary-adhesive layer exerts a temporary-adhesive strength or cohesion (cohesive force). In a case where a crosslinking agent described below is contained in the temporary-adhesive composition, components in the temporary-adhesive composition react with one another and are in the state of having exerted a temporary-adhesive strength or cohesion. Further, In a case where the temporary-adhesive is radiation-curable, the temporary-adhesive layer is in the state in which a radiation-polymerizable compound described below or a radiation-curable temporary-adhesive is not yet subjected to polymerization and curing. The temporary-adhesive layer after polymerization and curing of the temporary-adhesive due to radiation exposure is referred to as "a cured temporary-adhesive layer".

In the present invention, the mask material layer means a coating layer of a mask material composition, and is in the state in which a temporary-adhesive contained in the mask material layer exerts a temporary-adhesive strength or cohesion. In a case where a crosslinking agent described below is contained in the mask material composition, components in the mask material composition react with one another and are in the state of having exerted a temporary-adhesive strength or cohesion. Further, in a case where the mask material is radiation-curable, the mask material layer is in the state in which a radiation-polymerizable compound described below or a radiation-curable temporary-adhesive is not yet subjected to polymerization and curing. The mask material layer after polymerization and curing of the temporary-adhesive due to radiation exposure is referred to as "a cured mask material layer".

Preferable embodiments of the method of producing a semiconductor chip using the mask-integrated surface protective tape with a release liner of the present invention (hereinafter, simply referred to as "production method to which the present invention is applied") are described below with reference to the drawings. However, the present invention is not limited to the following embodiments, except for the requirements defined by the present invention. Further, the form shown in each drawing is a schematic view for facilitating the understanding of the present invention. Therefore, regarding the size, the thickness, the relative size relation and the like of each component, the size of the components is sometimes changed for the purpose of illustration, and the form does not show a real relation as it is. Further, the present invention is not limited to outer forms and shapes shown in these figures, except for the requirements defined by the present invention.

Preferable embodiments of the production method to which the present invention is applied may be classified into first and second embodiments, as described below.

First Embodiment [FIGS. 1 to 6]

The first embodiment of a production method to which the present invention is applied is described with reference to FIG. 1 to FIG. 6.

As shown in FIG. 1, the mask-integrated surface protective tape with a release liner 101 according to the present invention has a base film 3aa, a temporary-adhesive layer 3ab, a release film 3ac, a mask material layer 3b, and a release liner 3c. By peeling the release liner 3c from the mask-integrated surface protective tape with a release liner 101, a mask-integrated surface protective tape 3 is made. At this moment, in the mask-integrated surface protective tape with a release liner 101, the peeling strength between the release liner 3c and the mask material layer 3b is smaller than the peeling strength between the release film 3ac and the mask material layer 3b.

Figure 2A:
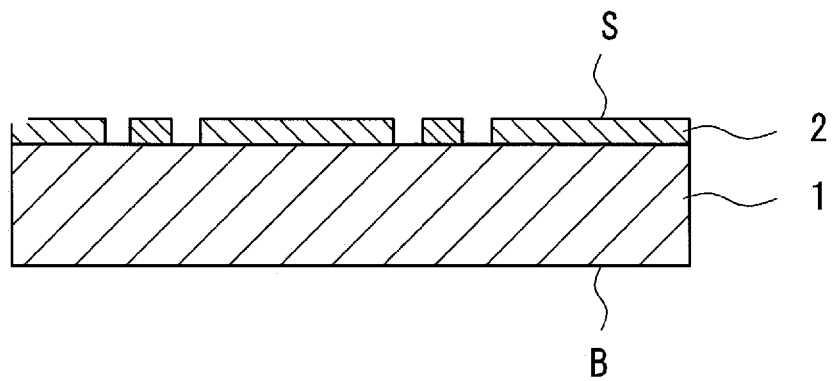
FIGS. 2(a) to 2(c) are outline cross-sectional views explaining steps until a mask-integrated surface protective tape (a laminate obtained by excluding the release liner from the mask-integrated surface protective tape with a release liner) is laminated onto a semiconductor wafer, in the first embodiment using the mask-integrated surface protective tape with a release liner of the present invention. In the views, fragmentary
Figure 2B:
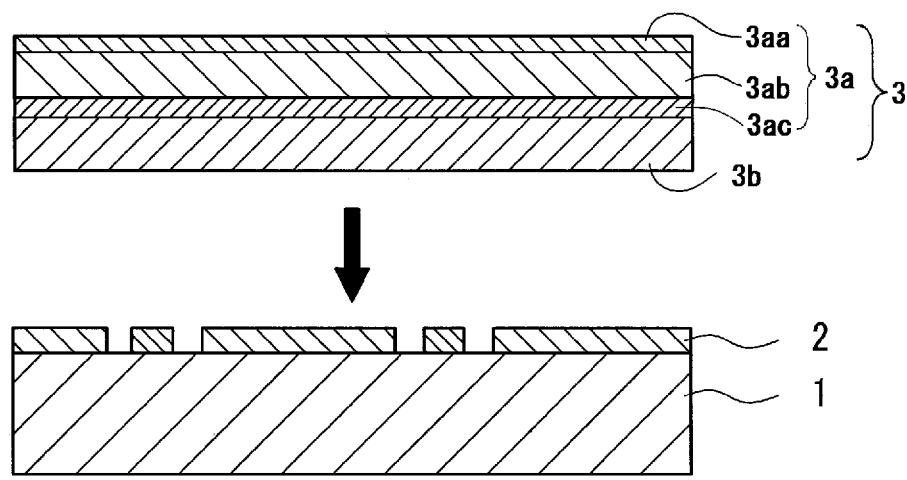
Figure 2C:
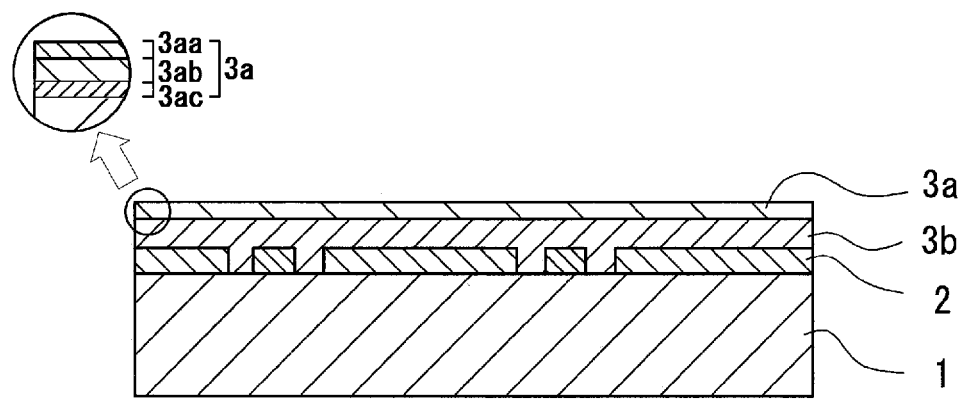

The semiconductor wafer 1 has a patterned face 2 having an asperity resulting from a circuit of the semiconductor device or a bump and the like formed at its surface S (see FIG. 2(a)). On this patterned face 2, the mask-integrated surface protective tape 3 having the base film 3aa, the temporary-adhesive layer 3ab, the release film 3ac, and the mask material layer 3b is laminated (see FIG. 2(b)), thereby to obtain a semiconductor wafer 1 in which the patterned face 2 has been covered with the mask-integrated surface protective tape 3 (see FIG. 2(c)).

When the mask-integrated surface protective tape 3 is laminated on the patterned face 2, the release liner 3c is peeled from the mask-integrated surface protective tape with a release liner 101. At this moment, since the mask-integrated surface protective tape with a release liner 101 has the relationship of the peeling strengths as described below, the mask material layer can be prevented from being peeled from the release film with adhesion to the release liner. Further, even if the release liner is peeled, peeling marks do not remain on the surface of the mask material layer. Accordingly, the surface of the mask material layer is flat, so that high adhesion between the patterned face 2 and the mask material layer can be realized as described below (see FIG. 2(c)). This effect can be also exerted equally in a case where the mask material layer is formed by a material which has an excellent following property as described below.

In the present invention, a method of peeling the release liner is not particularly limited and known methods can be applied.

Figure 3A:
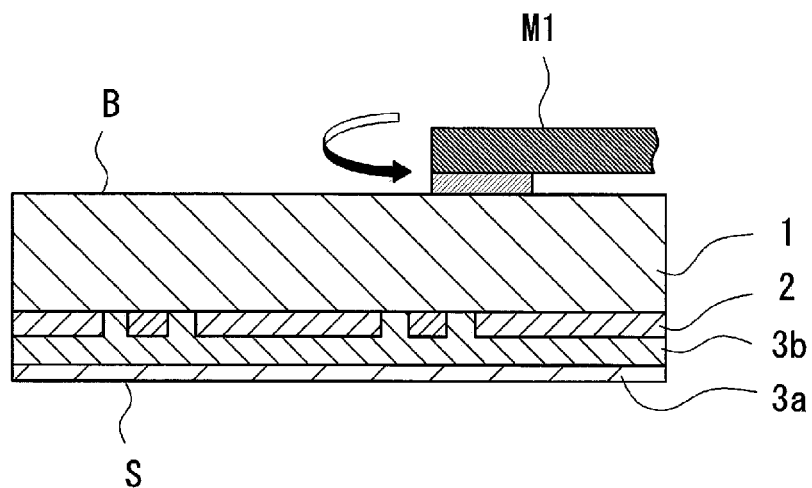
FIGS. 3(a) to 3(c) are schematic end views illustrating steps to thinning and fixing of the semiconductor wafer, in the first embodiment using the mask-integrated surface protective tape with a release liner of the present invention. In the views, fragmentary
Figure 3B:
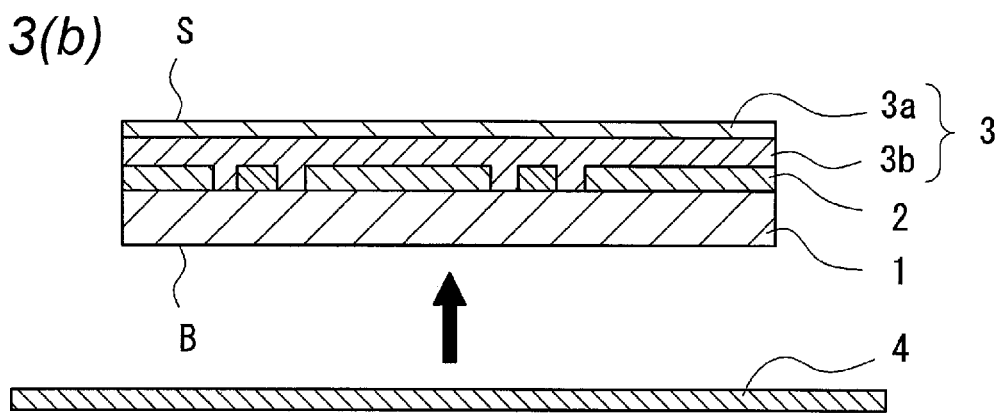

Then, the backing-face B of the semiconductor wafer 1 is ground by a wafer-grinding apparatus M1, to thin a thickness of the semiconductor wafer 1 (see FIG. 3(a)). On the ground backing-face B, a wafer-fixing tape 4 is laminated (see FIG. 3(b)), to support and fix the wafer to a ring flame F (see FIG. 3(c)).

Figure 4A:
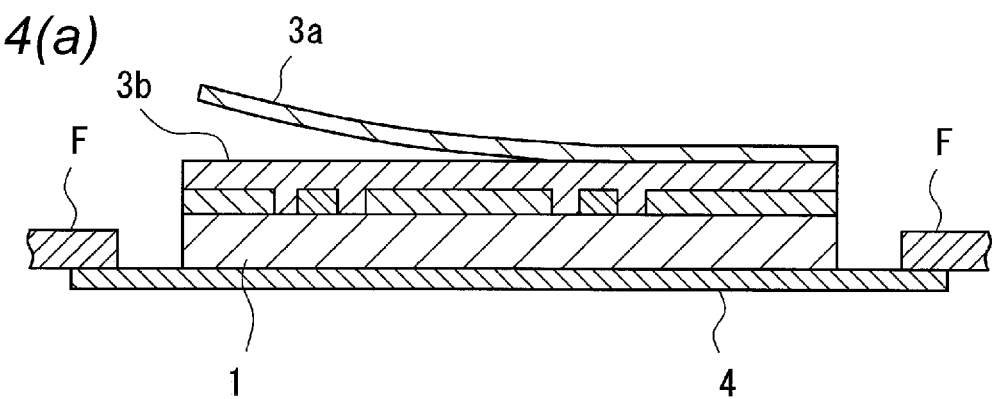
FIGS. 4(a) to 4(c) are schematic end views illustrating steps to the mask formation, in the first embodiment using the mask-integrated surface protective tape with a release liner of the present invention. In the views, fragmentary
Figure 4B:
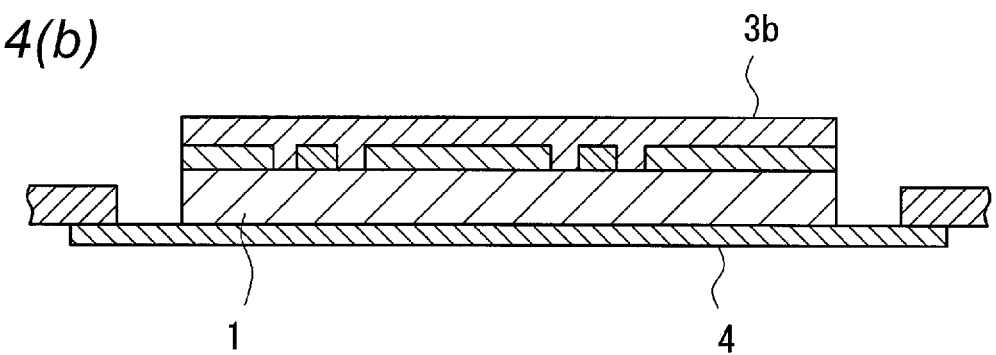

While peeling a laminate 3a composed of the base film, the temporary-adhesive layer and the release film of the mask-integrated surface protective tape 3 from the semiconductor wafer 1, the mask material layer 3b thereof is left on the semiconductor wafer 1 (see FIG. 4(a)), thereby to expose the mask material layer 3b on top (see FIG. 4(b)). At this moment, in the mask-integrated surface protective tape 3, the peeling strength between the mask material layer 3b and the release film 3ac is smaller than the peeling strength between the mask material layer 3b and the patterned face 2 of the semiconductor wafer.

The surface of the mask material layer on the side opposite to the base film has a property such that the peeling strength to the release liner, when not in use, satisfies the above-described relationship, whereas after laminating the mask material layer on the semiconductor wafer, the peeling strength to the surface S satisfies a reverse relationship.

The surface of the release film 3ac which is in contact with the mask material layer 3b has been subjected to a release treatment as described below. In contrast, the patterned face 2 is not subjected to a release treatment. Accordingly, the mask material layer adheres tightly to the patterned face 2 by stronger adhesion than the release film 3ac and therefore results in satisfaction of the above-described relationship of the peeling strength.

In this way, in the present invention, by controlling a peeling strength to a component to be peeled depending on the condition (presence or absence of release treatment) and the like of the surface with which the mask material layer 3b is in contact, it is possible to timely and selectively peel the component to be peeled without damaging the shape or surface conditions of the mask material layer.

This allows the above 2 peeling operations.

Figure 4C:
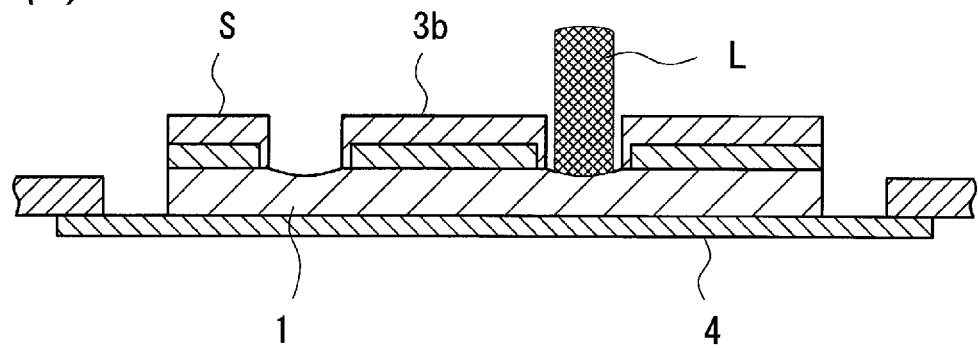

Further, $CO_2$ laser L is irradiated from the surface S side toward a plurality of streets (not shown) appropriately formed in a grid pattern or the like onto the patterned face 2, thereby to remove a portion corresponding to a street of the mask material layer 3b, so that streets of the semiconductor wafer are opened (see FIG. 4(c)).

Figure 5A:
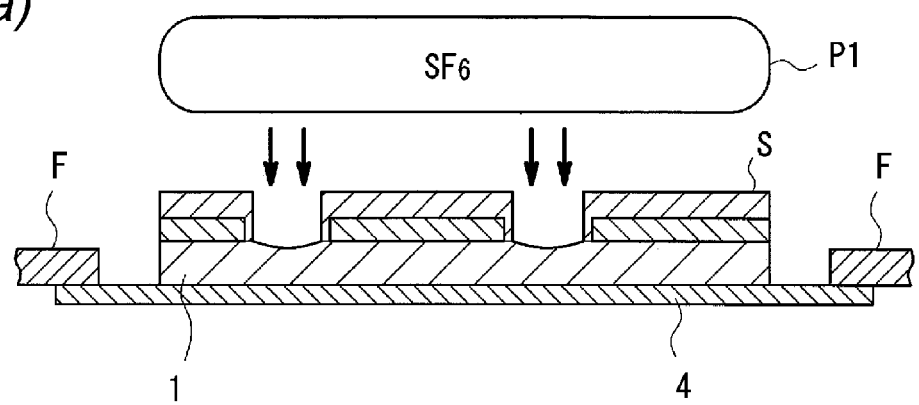
FIGS. 5(a) to 5(c) are schematic end views illustrating the plasma dicing and plasma ashing steps, in the first embodiment using the mask-integrated surface protective tape with a release liner of the present invention. In the views, fragmentary
Figure 5B:
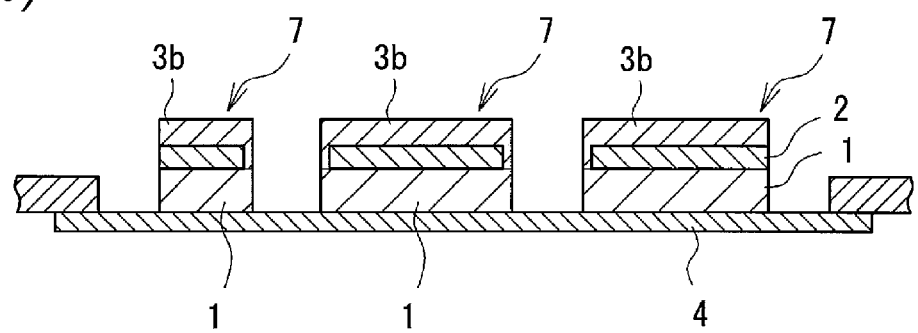
Figure 5C:
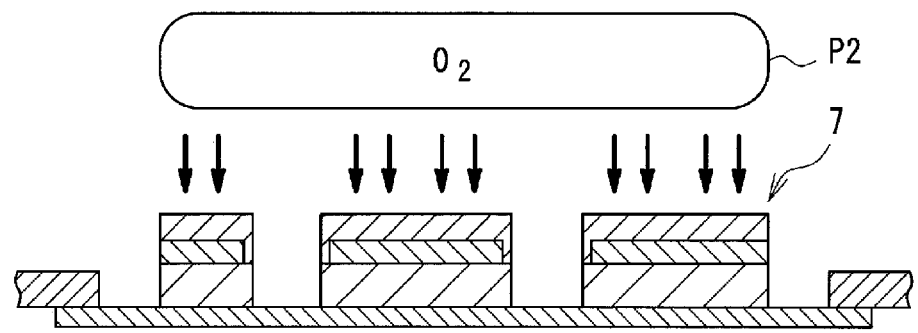
Figure 6A:
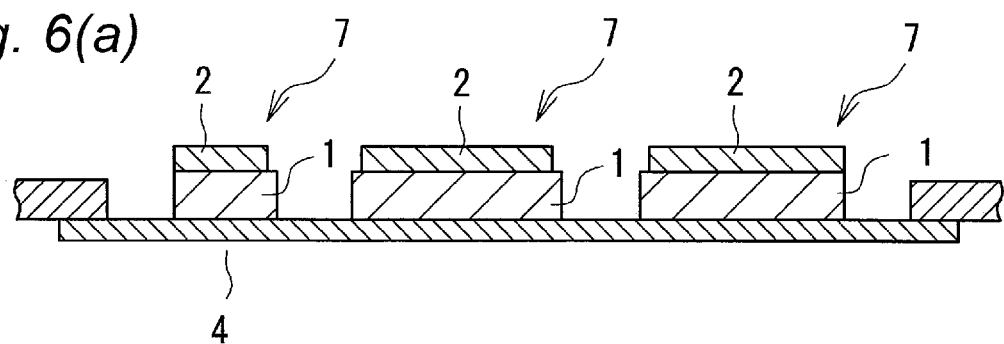
FIGS. 6(a) and 6(b) are schematic end views illustrating steps to picking up a chip, in the first embodiment using the mask-integrated surface protective tape with a release liner of the present invention. In the views, fragmentary
Figure 6B:
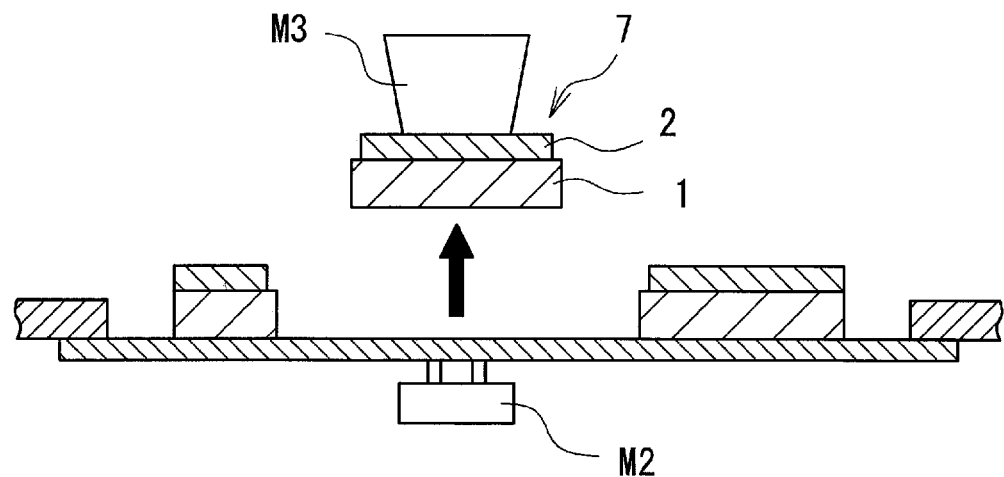

Then, a treatment with the plasma P1 of $SF_6$ gas is carried out from the surface S side, thereby to etch the semiconductor wafer 1 which is exposed at the street portion (see FIG. 5(a)), and the semiconductor wafer is divided into individual chips 7, which results in singulation (see FIG. 5(b)). After that, ashing with the plasma P2 of $O_2$ gas is carried out (see FIG. 5(c)), thereby to remove the mask material layer 3b remaining on the surface S (see FIG. 6(a)). Then, at last, the singulated chip 7 is knocked up by a pin M2, and is picked up by adsorption with a collet M3 (see FIG. 6(b)).

Herein, a process of etching of Si of the semiconductor wafer with the use of $SF_6$ gas is also called as a BOSCH process. This process allows a reaction of the exposed Si and a fluorine atom formed from a plasmarized $SF_6$, thereby to remove the exposed Si as silicon tetrafluoride ($SiF_4$), which is also called as reactive ion etching (RIE). On the other hand, the removal with the $O_2$ plasma is a method which is also used as plasma cleaner in the course of a semiconductor production process, and is also called as ashing (ash-making), which is one of means for removal of the organic substance. This method is carried out, in order to clean an organic substance residue remaining on a semiconductor device surface. By reacting an oxygen atom formed by plasmarization and a carbon atom of the mask material component, the carbon atom is removed as carbon oxide gas ($CO_2$) and the like. Meanwhile, as the plasma P1, any plasma (for example, carbon tetrafluoride ($CF_4$)) other than the $SF_6$ plasma also can be used, as long as it can remove the mask material layer. Further, as P2, any plasma other than the $O_2$ plasma also can be used, as long as it allows the above-described ashing.

Second Embodiment [FIG. 7]

This embodiment is different from the first embodiment in the point that the second embodiment contains a step (ab) of curing the mask material layer by irradiating the mask-integrated surface protective tape 3 with a radiation, such as an ultraviolet light or the like, prior to the step of peeling-off the laminate 3a composed of the base film, the temporary adhesive layer, and the release film in the first embodiment. Other steps are the same as in the first embodiment.

Figure 3C:
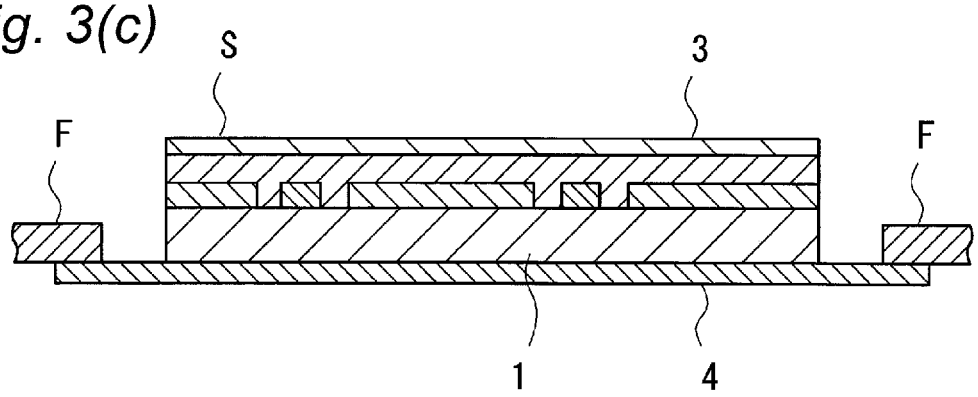
Figure 7A:
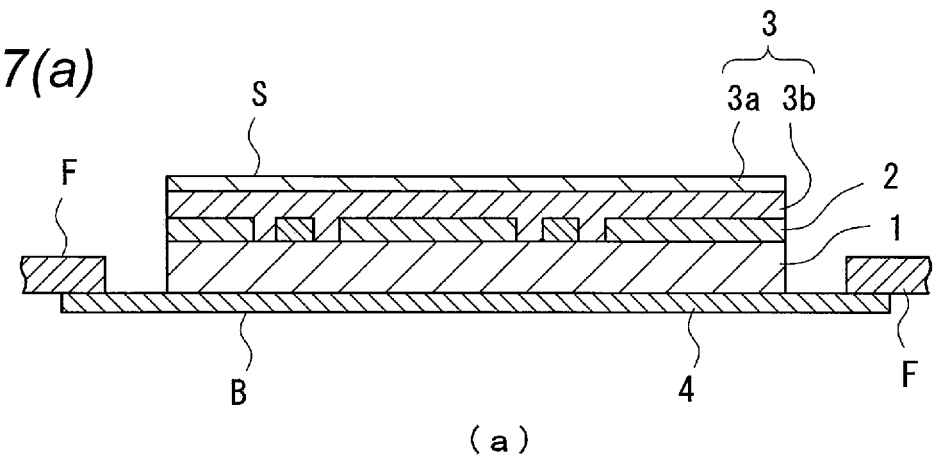
FIGS. 7(a) to 7(c) are schematic end views illustrating a state before and after a treatment with an ultraviolet irradiation carrying out, in the second embodiment using the mask-integrated surface protective tape with a release liner of the present invention. In the views, Fragmentary
Figure 7B:
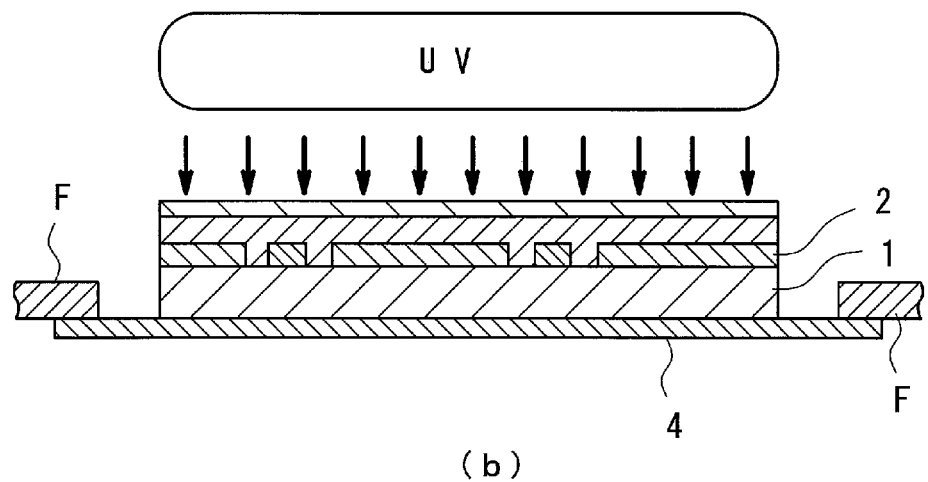
Figure 7C:
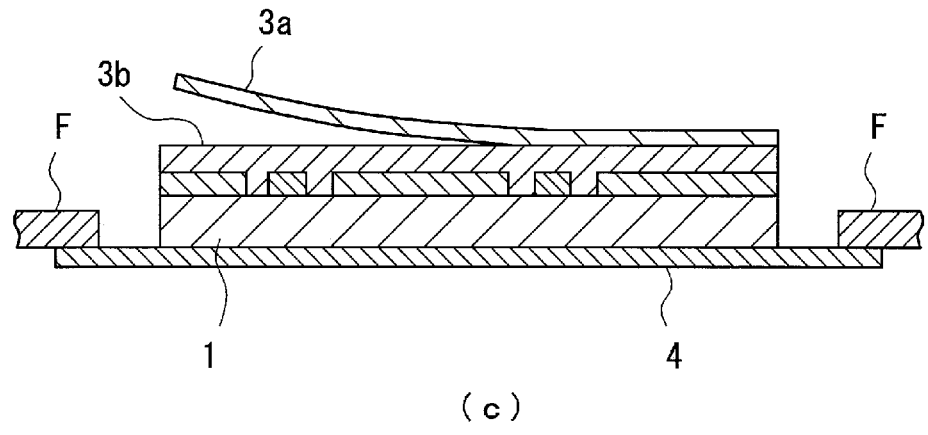

Specifically, the mask-integrated surface protective tape 3 is laminated on the surface S side of the semiconductor wafer 1, and the wafer-fixing tape 4 is laminated on the ground backing-face B side of the semiconductor wafer 1, followed by supporting and fixing the wafer to a ring flame F (see FIG. 3(c), FIG. 7(a)). Then, an ultraviolet light UV is irradiated from the surface S side toward the mask-integrated surface protective tape 3 (see FIG. 7(b)). Then, after curing the mask material layer 3b of the mask-integrated surface protective tape 3, the laminate 3a composed of the base film, the temporary adhesive layer and the peeling film is removed (see FIG. 7(c)), whereby the mask material layer 3b is uncovered. Then, this step is transited to a step of cutting, with a laser L, a portion of the mask material layer 3b corresponding to the street.

In the present embodiment, before peeling the laminate 3a, the mask material layer is made to be a cured mask material layer, in addition to an appropriate change of the peeling strength as described above. This allows further reduction of peeling strength due to the cured mask material layer, thereby to strengthen the above-described selective peelability due to peeling strength. Accordingly, the mask-integrated surface protective tape with a release liner for use in the second embodiment of the present invention can achieve the effects of the present invention at a higher level.

The mask-integrated surface protective tape with a release liner used in the present embodiment corresponds to the mask-integrated surface protective tape with a release liner 101 described in the first embodiment, where a material curable with a radiation, such as ultraviolet, is used in the mask material layer 3b.

Curing of the mask material layer 3b with an ultraviolet etc. radiation allows the peeling between the laminate 3a composed of the base film, the temporary adhesive layer and the release film and the mask material layer 3b while maintaining a surface state of the mask material layer in better condition.

Hereinafter, materials and the like used in the above-described first embodiment and second embodiment are explained together.

Note that, as the apparatus, the materials and the like used in these embodiments, an ordinary apparatus, materials and the like which have been conventionally used in the processing of semiconductor wafers may be used, unless otherwise indicated, and the conditions of use for them can be appropriately set and optimized in accordance with the intended use within a range of an ordinary method for using. Further, omitted are duplicated descriptions about the materials, structures, methods, effects, and the like, which are common to each embodiment.

Note that the materials described below are those which can be preferably used in all of the mask-integrated surface protective tape with a release liner of the present invention and therefore are not limited to the case of using the mask-integrated surface protective tape with a release liner of the present invention in the above described method.

The semiconductor wafer 1 is a silicon wafer, on its one side, having the patterned face 2. The patterned face 2 is a face on which the circuit or the like of the semiconductor device is formed, which has a street in a planar view.

The mask-integrated surface protective tape with a release liner 101 according to the present invention has a configuration in which a temporary-adhesive layer 3ab is provided on a base film 3aa, and a release film 3ac is provided on the temporary-adhesive layer 3ab, and a mask material layer 3b is provided on the release film 3ac, and further the release liner 3c is provided on the mask material layer 3b, and has a function to protect a patterned face 2. Specifically, at the backgrinding step of the semiconductor wafer (hereinafter, sometimes referred to as "wafer-thinning step") in the step (a) which is a post-step, while supporting the semiconductor wafer 1 at the patterned face 2, the backing-face of the semiconductor wafer is ground. Therefore, the mask-integrated surface protective tape 3 needs to withstand a load in this grinding. For this reason, the mask-integrated surface protective tape 3 is different from a mere resist film or the like, and has a thickness enough to absorb an asperity on the patterned face, has a low pressing resistance, and has a high adhesion that can adhere tightly to the wafer surface so that the infiltration of dusts, grinding water, and the like, in grinding, is not occurred.

The base film 3aa is composed of a plastic, a gum, or the like, and examples of its materials include: a homopolymer or copolymer of α-olefin, such as a polyolefin resin including polyethylene (including low density polyethylene (LDPE)), polypropylene and ethylene/propylene copolymer, polybutene-1, poly-4-methylpentene-1, ethylene/vinyl acetate copolymer (EVA), ethylene/acrylic acid copolymer, and ionomers, or a mixture thereof; an elemental substance or a mixture of 2 or more kinds, such as polyethylene terephthalate, polyethylene naphthalate, polyphenylene sulfide, polyether imide, polyimide, polycarbonate, polymethyl methacrylate, polyurethane, and styrene/ethylene/butene- or pentene-based copolymer; and a resin composition in which another resin, a filler, an additive or the like is blended with any of the foregoing polymers. These can be arbitrary selected depending on the required characteristics.

The base film 3aa may have a single layer structure or a multi-layer structure.

The base film 3aa preferably has a layer composed of a polyolefin resin. In this case, the base film 3aa may be a single layer composed of a polyolefin resin layer, or may have a multi-layer structure of two or more layers composed of a polyolefin resin layer and other resin layer. Example thereof include a laminate of a layer made of a low-density polyethylene and a layer made of an ethylene-vinyl acetate copolymer, and a laminate of a layer made of polypropylene and a layer made of polyethylene terephthalate. Further, polyethylene terephthalate and polyethylene naphthalate are materials suitable for the base film.

As described below, after the wafer-thinning step, a laminate composed of the base film, the temporary-adhesive layer and the release film is peeled. On this occasion, it is common to adhere a heat seal onto a back of the base film by heat lamination and then to tear off the laminate together with the heat seal. From the viewpoint of adhesion to the heat seal, a material of the base film on the side opposite to the temporary-adhesive layer is preferably a low-density polyethylene or an ethylene-vinyl acetate copolymer. Specifically, in a case where the base film has a single layer structure, the material of the base film is preferably a low-density polyethylene or an ethylene-vinyl acetate copolymer. Further, in a case where the base film $3aa$ has a multi-layer structure, the material of the layer on the side opposite to the surface which contacts to the temporary-adhesive layer, is preferably a low-density polyethylene or an ethylene-vinyl acetate copolymer.

A thickness of the base film $3aa$ is preferably from 20 to 200 μm, more preferably 50 to 170 μm, and particularly preferably 80 to 160 μm, from the viewpoint of strength property/elongation property, and radiation permeation property.

The foregoing base film $3aa$ can be produced using a general extrusion method. In the case where the base film $3aa$ is obtained by laminating various resins, these are produced by a co-extrusion method, a lamination method or the like. At this time, as conventionally practiced in the ordinary production method of laminate films, an adhesion layer may be provided between resins.

In order to make the mask-integrated surface protective tape withstand a load of the wafer-thinning step, it is preferable that the adhesion property of the temporary-adhesive layer $3ab$ to the release film $3ac$ and to a base film $3aa$ in the wafer-thinning step is high. On the other hand, after the wafer-thinning step, because the temporary-adhesive layer $3ab$ is integrally peeled with the base film $3aa$ and the release film $3ac$ from the mask material layer $3b$, it is preferable that the adhesion property of the temporary-adhesive layer $3ab$ to the base film $3aa$ and the release film $3ac$ is high (low peeling property is preferable).

A temporary-adhesive contained in the temporary-adhesive layer $3ab$ is not specified in particular. However, from staining properties, acrylic temporary-adhesives are preferred. Herein, the acrylic temporary-adhesive means a (meth)acrylic polymer, or a mixture of a (meth)acrylic polymer and a crosslinking agent.

Examples of the (meth)acrylic polymer include a polymer or copolymer having a (meth)acrylic acid ester as a constituent, or a mixture of these. The mass-average molecular weight of these polymers or copolymers is normally about 300,000 to 1,000,000. A proportion of the (meth)acrylic acid ester component of the total monomer component of the (meth)acrylic polymer is preferably 70% or more, more preferably 80% or more, and further more preferably 90% or more. Further, in a case where the proportion of the (meth) acrylic acid ester component of the total monomer component of the (meth)acrylic polymer is not 100% by mole, it is preferable that the remaining monomer component is a monomer component (constituent and the like derived from (meth)acrylic acid) existing in the form of (meth)acryloyl group polymerized as a polymerizable group. Further, the proportion of the (meth)acrylic acid ester component having a functional group (for example, hydroxyl group) reacting with a crosslinking agent described below, of the total monomer component of the (meth)acrylic polymer is preferably 1% by mole or more, more preferably 2% by mole or more, further more preferably 5% by mole or more, and still further more preferably 10% by mole or more. A proportion of the (meth)acrylic acid ester component is preferably 35% by mole or less, more preferably 25% by mole or less.

The above-described (meth)acrylic acid ester component is preferably a (meth)acrylic acid alkyl ester (also referred to as alkyl (meth)acrylate). The number of carbon atoms of the alkyl group which constitutes the (meth)acrylic acid alkyl ester is preferably from 1 to 20, more preferably from 1 to 15, and further more preferably from 1 to 12.

The content (content converted to the state before reacting with a crosslinking agent) of the (meth)acrylic polymer in the temporary-adhesive layer $3ab$ is preferably 80% by mass or more, more preferably 90% by mass or more, and still more preferably from 95 to 99.9% by mass.

The crosslinking agent is used to exhibit an adhesive force and a cohesion force by reacting it with a functional group which the (meth)acrylic polymer has. Examples thereof include: an epoxy compound having 2 or more epoxy groups in the molecule (hereinafter, also referred to as "epoxy-series crosslinking agent"), such as 1,3-bis(N,N-diglycidyl aminomethyl)cyclohexane, 1,3-bis(N,N-diglycidyl aminomethyl)toluene, 1,3-bis(N,N-diglycidyl aminomethyl)benzene, N,N,N',N'-tetraglycidyl-m-xylenediamine, ethylene glycol diglycidyl ether, or terephthalic acid diglycidyl ester acrylate; an isocyanate compound having 2 or more isocyanate groups in the molecule (hereinafter, also referred to as "isocyanate-series crosslinking agent"), such as 2,4-tolylenediisocyanate, 2,6-tolylenediisocyanate, 1,3-xylylenediisocyanate, 1,4-xylylenediisocyanate, diphenylmethane-4,4'-isocyanate, hexamethylene diisocyanate, isophorone diisocyanate, or an adduct type of these; an aziridine compound having 2 or more aziridinyl groups in the molecule (aziridine-series crosslinking agent), such as tetramethylol-tri-β-aziridinyl propionate, trimethylol-tri-β-aziridinyl propionate, trimethylolpropane-tri-β-aziridinyl propionate, trimethylolpropane-tri-β-(2-methylaziridine) propionate, tris-2,4,6-(1-aziridinyl)-1,3,5-triazine, tris[1-(2-methyl)-aziridinyl]phosphine oxide, or hexa[1-(2-methyl)-aziridinyl]triphosphatriazine; and the like.

An addition amount of the crosslinking agent may be set depending on a desired adhesion force, and is suitably from 0.1 to 5.0 mass parts with respect to 100 mass parts of the (meth)acrylic polymer.

In the temporary-adhesive layer $3ab$, a so-called pressure-sensitive temporary-adhesive that is non-radiation-curable is preferably used. As for the pressure-sensitive temporary-adhesive, the above-described mixture of a (meth)acrylic polymer and a crosslinking agent can be preferably used.

A temporary-adhesive of the above-described temporary-adhesive layer $3ab$ may be a temporary-adhesive composed of a radiation-polymerizable compound described below, or a radiation-curable temporary-adhesive (that is, the layer may be made to be a radiation-curable temporary-adhesive layer).

The temporary-adhesive layer $3ab$ may further contain any of known tackifier, softener, antioxidant, or the like.

As for the temporary-adhesive layer 3ab, those embodiments described at paragraphs [0036] to [0055] of JP-A-2014-192204 are also preferably applied.

The thickness of the temporary-adhesive layer 3ab is preferably from 5 to 100 μm, from the viewpoint of more increasing protective ability to the device and the like formed on the patterned surface 2.

A method of forming the temporary-adhesive layer is not limited in particular and an ordinary method can be adopted. For example, the temporary-adhesive layer can be formed by preparing a temporary-adhesive composition and then coating and drying (for example, heat drying) the temporary-adhesive composition.

The temporary-adhesive composition can be prepared by adding, if needed, a commonly used solvent to an acrylic temporary-adhesive, a temporary-adhesive composed of an acrylic temporary-adhesive and a radiation-polymerizable compound, or a pressure-sensitive temporary-adhesive.

A material of the release film 3ac is not limited in particular, and polyethylene terephthalate, polypropylene, and the like may be used.

The release film 3ac has a release treated surface on one side thereof. The release treatment is commonly carried out by coating a silicone-based or fluorine-based releaser or the like on a film. Herein, by adjusting the kind of the releaser, the coating thickness, the coating method, and the like, the relationship between a peeling strength between the mask material layer and the release film and a peeling strength between the mask material layer and the release liner can be put into a predetermined state.

The release film 3ac is arranged so as to have contact with the mask material layer on the release treated surface thereof.

The surface of the release film 3ac on the side opposite to the release treated surface is preferably subjected to an adhesion treatment. By being subjected to the adhesion treatment, adhesion between the temporary-adhesive layer and the release film is improved and this helps selective peeling of only the mask material layer. The adhesion treatment includes a corona treatment.

The tensile elastic modulus of the release film is preferably 1.5 GPa or more. If the tensile elastic modulus is 1.5 GPa or more, a warpage of the semiconductor wafer itself after the thin film grinding can be suppressed, so that a handling error can be further reduced. The tensile elastic modulus can be measured at a test speed of 300 mm/min in conformity to JIS K 7127. The above-described tensile elastic modulus may be set appropriately depending on selection of the release film material, selection of the thickness, and the like.

The thickness of the release film is preferably from 25 to 75 μm. If the thickness is within this range, the warpage of the semiconductor wafer itself can be suppressed and further, chip breakage due to excessive peeling strength of the release film also can be suppressed.

The producing method of a release film is not limited in particular and an ordinary method can be adopted. For example, it can be produced by a coating. Further, a commercial item can be also used.

The mask material layer 3b is required to have resistance to $SF_6$ plasma and to provide a mask material that is removable by laser-cut and/or $O_2$ plasma. Further, the mask material layer plays a role to protect a patterned face by absorbing an asperity of the patterned face thereby to increase adhesion to the patterned face. In order to peel the release liner from the mask-integrated surface protective tape with a release liner while maintaining a surface condition of the mask material layer, adhesion between the release film and the mask material layer is larger (peelability is lower) than adhesion between the release liner and the mask material layer. In order to make the mask-integrated surface protective tape withstand the load of wafer-thinning step, it is preferable for the mask material layer 3b to have high adhesion to the release film 3ac in the wafer-thinning step. On the other hand, after the wafer-thinning step, in order to peel the laminate composed of the base film, the temporary-adhesive layer and the release film so that a mask material layer is exposed on top of the wafer, the adhesion between the mask material layer and the release film is preferably lower (peelability is preferably higher) than the adhesion between the mask material layer and the semiconductor wafer. In order to realize such properties at a higher level, it is preferable to adopt a radiation-curable temporary-adhesive or the like in the mask material layer 3b. By modifying the mask material layer 3b to be a radiation-curable temporary-adhesive layer, the mask material can be polymerized and cured by radiation exposure which results in lowering of temporary-adhesion strength. Therefore, by radiation exposure to the mask material layer 3b after the wafer-thinning step, strong adhesion of the mask material layer 3b to the release film 3ac can be taken off so that this allows easy peeling from the release film 3ac (such embodiment is specifically described below).

In the present specification, the term "radiation" is a concept including both a light beam such as ultraviolet, and an ionizing radiation such as an electron beam. The radiation for use of the present invention is preferably ultraviolet.

The mask material layer preferably contains: an acrylic temporary-adhesive that can be used in the above-described temporary-adhesive layer; a temporary-adhesive composed of the acrylic temporary-adhesive that can be used in the above-described temporary-adhesive layer and a radiation-polymerizable compound described below; or a radiation-curable temporary-adhesive. It is more preferable to contain: a temporary-adhesive composed of the above-described acrylic temporary-adhesive and a radiation-polymerizable compound described below; or a radiation-curable temporary-adhesive. Herein, the expression "the mask material layer 3b contains a (meth)acrylic temporary-adhesive" means to include an embodiment in which a (meth)acrylic polymer is present in a state of reacted with a crosslinking agent.

In the mask material layer, a so-called pressure-sensitive temporary-adhesive that is non-radiation-curable is used. As this pressure-sensitive temporary-adhesive, a mixture of a (meth)acrylic polymer and a crosslinking agent that can be used in the above-described temporary-adhesive layer can be preferably used. Preferable examples of the (meth)acrylic polymer and the crosslinking agent are also the same.

Further, in a case of the second embodiment, the mask material layer is preferably radiation-curable. As the radiation-curable temporary-adhesive, a temporary-adhesive composed of the above-described acrylic temporary-adhesive and the radiation-curable compound described below; or a radiation-curable temporary-adhesive can be preferably used.

The above-described temporary-adhesive composed of the acrylic temporary-adhesive and the radiation-polymerizable compound is explained.

A preferable range and the like of the acrylic temporary-adhesive for use in the mask material layer are the same as the acrylic temporary-adhesive that can be used in the above-described temporary-adhesive layer.

As for the radiation-polymerizable compound described above, a low-molecular weight compounds having, in the molecule, at least two or more photopolymerizable carbon-carbon double bonds which can be polymerized by radiation irradiation are widely used. Specifically, use may be widely applicable of: acrylate-based compounds such as trimethylolpropane triacrylate, tetramethylolmethane tetraacrylate, pentaerythritol triacrylate, pentaerythritol tetraacrylate, dipentaerythritol mono-hydroxypentaacrylate, dipentaerythritol hexaacrylate, 1,4-butyleneglycol diacrylate, 1,6-hexanediol diacrylate, polyethyleneglycol diacrylate, and oligo-ester acrylates.

Further, in addition to the acrylate-based compounds, use can be also made of a urethane acrylate-based oligomer. The urethane acrylate-based oligomer is obtained by conducting reaction of an acrylate or methacrylate having a hydroxy group (for example, 2-hydroxyethyl acrylate, 2-hydroxyethyl methacrylate, 2-hydroxypropyl acrylate, 2-hydroxypropyl methacrylate, polyethyleneglycol acrylate, polyethyleneglycol methacrylate, and the like) with a urethane prepolymer having an isocyanate group at the end thereof, which is obtained by conducting reaction of a polyol compound, such as a polyester type- or a polyether type-polyol, and a polyvalent isocyanate compound (for example, 2,4-tolylene diisocyanate, 2,6-tolylene diisocyanate, 1,3-xylylene diisocyanate, 1,4-xylylene diisocyanate, diphenyl methane-4,4'-diisocyanate, and the like).

As a blending ratio of the acrylic temporary-adhesive and the radiation-polymerizable compound in the radiation-curable temporary-adhesive including the acrylic temporary-adhesive and the radiation-polymerizable compound, the radiation-polymerizable compound is desirably blended in the range of 50 to 200 mass parts and preferably 50 to 150 mass parts with respect to 100 mass parts of the acrylic temporary-adhesive. If the blending ratio is in this range, it is possible to decline sharply the adhesion force of the temporary-adhesive layer after radiation irradiation.

The above-described radiation-curable temporary-adhesive is explained. As the radiation-curable temporary-adhesive, it is also preferable to use a radiation-polymerizable (meth)acrylic polymer in which the above-described (meth)acrylic polymer itself has been rendered radiation-polymerizable. In this case, the radiation-curable temporary-adhesive may contain a crosslinking agent. As the crosslinking agent, use can be made of a crosslinking agent that can be used in the temporary-adhesive layer.

The radiation-polymerizable (meth)acrylic polymer is a polymer having, in the molecule of the polymer, a reactive group which is capable of realizing a polymerization reaction upon exposure to a radiation, particularly to an ultraviolet. As the reactive group, an ethylenically unsaturated group, in other words, a group having a carbon-carbon double bond (ethylenically unsaturated bond), is preferred. Examples thereof include: a vinyl group, an allyl group, a styryl group, a (meth)acryloyloxy group, a (meth)acryloylamino group, and the like.

The introduction of the above-described reactive group to the polymer may be performed, for example, by reacting a polymer having a hydroxyl group with a compound having both a group (for example, isocyanate group) reactive with the hydroxyl group and the above-described reactive group [representatively 2-(methacryloyloxy)ethyl isocyanate].

It is preferable that a (meth)acrylic acid alkyl ester component of which the number of carbon atoms in the alcohol portion is from 8 to 12 is contained in the monomer components which constitute the (meth)acrylic polymer having an ethylenically unsaturated bond at the side chain thereof, which constitutes the mask layer 3b. Of the monomer components which constitute the (meth)acrylic polymer having an ethylenically unsaturated bond at the side chain thereof, the percentage of the (meth)acrylic acid alkyl ester component of which the number of carbon atoms in the alcohol portion is from 8 to 12 is preferably from 45 to 85% by mole, and more preferably from 50 to 80% by mole.

Herein, the "alcohol portion" of the (meth)acrylic acid alkyl ester component means a structure derived from an alcohol which forms an ester bond (in contrast, a structure derived from a (meth)acrylic acid of the (meth)acrylic acid alkyl ester component is called an acid portion). For example, in a case where the (meth)acrylic acid alkyl ester component is a 2-ethylhexyl acrylate component, the alcohol portion is a structure derived from 2-ethylhexanol and the acid portion is a structure derived from acrylic acid, so that the number of carbon atoms in the alcohol portion is 8. Further, in a case where the (meth)acrylic acid alkyl ester component is a lauryl acrylate component, the alcohol portion is a structure derived from 1-dodecanol and the acid portion is a structure derived from acrylic acid, so that the number of carbon atoms in the alcohol portion is 12.

Further, in the case of conducting polymerization and curing of a mask material layer 3b by radiation, a radiation polymerization initiator, for example, isopropylbenzoin ether, isobutylbenzoin ether, benzophenone, Michler's ketone, chlorothioxanthone, benzyl methyl ketal, α-hydroxycyclohexyl phenyl ketone, 2-hydroxymethylphenyl propane, and the like can be used. By adding at least one of these compounds to the mask material layer, a polymerization reaction can be efficiently accelerated.

The mask material layer 3b may further contain a photosensitizer, any of known tackifier, softener, antioxidant, or the like.

As for the mask material layer 3b, those embodiments described at paragraphs [0036] to [0055] of JP-A-2014-192204 are also preferably applied.

Further, the mask material layer 3b also preferably contains a fluorine-based release agent. Examples of the fluorine-based release agent include MEGAFAC (trade name, manufactured by DIC Corporation).

The storage elastic modulus at 25° C. of the mask material layer is preferably less than 100,000 Pa and particularly preferably less than 80,000 Pa. If the storage elastic modulus is less than 100,000 Pa, it is preferable because a mask material can be closely adhered without gaps to a wafer having an asperity.

The storage elastic modulus can be measured by the following method.

The storage elastic modulus can be measured under the condition of frequency 1 Hz at 25° C. using a shear viscoelasticity apparatus (trade name "ARES", manufactured by Rheometric Scientific, Inc.). As for the test specimen, a cylinder having a thickness of 2 mm and a diameter of 8 mm prepared by laminating mask material layers is used.

The storage elastic modulus can be adjusted by the kind of a temporary-adhesive, the kind of components contained in the temporary-adhesive, the content thereof and the like.

Further, the thickness of the mask material layer 3b is preferably larger than the asperity height of the patterned face of the semiconductor wafer on which the mask material layer is to be laminated. If the mask material layer does not follow sufficiently the semiconductor wafer, air remains in the gap between the mask material layer and the semiconductor wafer, so that the mask is sometimes destroyed at the vacuum step in the plasma processing. Further, if the mask material layer does not follow sufficiently the semiconductor wafer, the semiconductor wafer is contaminated with grinding water, which sometimes leads to the fall of the yield.

The thickness of the mask material layer, although not limited in particular, is preferably a maximum asperity height of the patterned surface of the semiconductor wafer+(0 to 50) μm, more preferably a maximum asperity height+(0 to 30) μm, and still more preferably a maximum asperity height+(0 to 10) μm.

The maximum asperity height, although not limited in particular, is preferably 50 μm or more.

In the explanation of the present invention, the maximum asperity height means a maximum value of a distance from the highest part of the convex to a wafer surface and a distance from the deepest part of the concave to the wafer surface.

The mask material of the mask material layer is preferably radiation-curable and more preferably ultraviolet-curable, from the viewpoint of selectively peeling the laminate composed of the base film, the temporary-adhesive layer and the release film from the mask material layer while maintaining the surface condition thereof.

The method of forming the mask material layer is not limited in particular and an ordinary method can be adopted. For example, the mask material layer can be formed by preparing a mask material composition, and then coating and drying (including heat drying) the mask material composition.

The mask material composition can be prepared, by adding, if needed, a commonly used solvent and the like to the above-described acrylic temporary-adhesive, a temporary-adhesive composed of the above-described acrylic temporary-adhesive and the radiation-polymerizable compound, or the above-described radiation-curable temporary-adhesive.

The material of the release liner is not limited in particular, and polyethylene terephthalate, polypropylene and the like can be used.

The release liner has a release-treated surface on one side thereof. Examples of the release treatment include the same treatment as in the above-described release film. The release liner is arranged so that the release liner has contact with a mask material layer at the release-treated surface. Herein, by adjusting a kind of the releaser, a coating thickness, a coating method and the like, a relationship between the peeling strength between the mask material layer and the release liner and the peeling strength between the mask material layer and the release film can be put into a given state.

The thickness of the release liner is preferably from 25 to 50 μm.

The method of forming a release liner is not limited in particular and an ordinary method can be adopted. For example, the release liner can be formed by coating. Further, a commercial item also can be used.

The peeling strength between each of layers of the mask-integrated surface protective tape with a release liner according to the present invention is explained.

(Before Peeling of Release Liner)

In the mask-integrated surface protective tape with a release liner according to the present invention, the peeling strength ($P_2$) between the release liner $3c$ and the mask material layer $3b$ is smaller than the peeling strength ($P_1$) between the release film $3ac$ and the mask material layer $3b$ ($P_1 > P_2$). By putting these peeling strengths into the above-described relationship, the release liner $3c$ can be peeled from the mask-integrated surface protective tape with a release liner while maintaining a surface condition of the mask material layer $3b$.

A difference ($P_1 - P_2$) between the peeling strength ($P_1$) between the release film $3ac$ and the mask material layer $3b$ and the peeling strength ($P_2$) between the release liner $3c$ and the mask material layer $3b$ is not limited in particular, as long as, in peeling the release liner $3c$, the mask material layer surface can be exposed on top while maintaining a surface condition thereof. The above-described difference between the peeling strengths is preferably 0.01 N/25 mm or more.

The peeling strength is measured at peeling angle of 90° and peeling speed of 50 mm/min under the conditions of 23° C. and 50% RH. For the other conditions reference can be made to JIS Z 0237.

The peeling strength ($P_1$) between the mask material layer $3b$ and the release film $3ac$ is preferably 0.02 N/25 mm or more and less than 1.0 N/25 mm. If the peeling strength ($P_1$) is 0.02 N/25 mm or more, in peeling the release liner $3c$, it is easy to selectively peel between the release liner $3c$ and the mask material layer $3b$. Further, If the peeling strength ($P_1$) is less than 1.0 N/25 mm, in peeling the laminate composed of the base film, the temporary-adhesive layer and the release film as described below, it is possible to leave the mask material layer $3b$ on the semiconductor wafer while maintaining a surface condition of the mask material layer.

(At the Time of Peeling Laminate Composed of Base Film, Temporary-Adhesive Layer, and Release Film)

The peeling strength ($P_1$) between the mask material layer $3b$ and the release film $3ac$ is smaller than the peeling strength ($P_3$) between the mask material layer $3b$ and the patterned face 2 of the semiconductor wafer ($P_1 < P_3$).

By putting them into such a relationship, at the step (b), it is possible to peel the laminate composed of the base film, the temporary-adhesive layer and the release film from the mask-integrated surface protective tap, thereby to expose the mask material layer $3b$ on top while maintaining a surface condition thereof.

The peeling strength can be measured by the above-described method.

(In a Case where Mask Material is Radiation-Curable in the Second Embodiment)

In a case where the mask-integrated surface protective tape with a release liner according to the present invention uses a radiation-curable temporary-adhesive and the like in the mask material layer $3b$ and after the wafer-thinning step, the mask material layer $3b$ is cured by radiation exposure, before curing by radiation exposure, a relationship between the peeling strength ($P_1$) between the mask material layer $3b$ and the release film $3ac$ and the peeling strength ($P_3$) between the mask material layer $3b$ and the patterned face 2 of the semiconductor wafer may be different from the first embodiment. For example, before curing by radiation exposure, it is preferred that the peeling strength ($P_3$) between the mask material layer $3b$ and the patterned face 2 of the semiconductor wafer and the peeling strength ($P_1$) between the mask material layer $3b$ and the release film $3ac$ are 0.2 N/25 mm or more. And after curing of the mask material layer $3b$ by radiation exposure, the relationship between the peeling strength ($P_1$) between the mask material layer $3b$ and the release film $3ac$ and the peeling strength ($P_3$) between the mask material layer $3b$ and the patterned face 2 of the semiconductor wafer is the same relationship as in the first embodiment. For example, it is preferable that the peeling strength between the cured mask material layer and the release film 3ac gets lower than the peeling strength between the cured mask material layer and the patterned face 2 of the semiconductor wafer.

Herein, in the measurement of the above-described peeling strength, taking ultraviolet exposure as an example, the ultraviolet exposure condition means that ultraviolet light is exposed to the entire mask-integrated surface protective tape from the base film side of the tape so as to be cumulative dose of 500 mJ/cm$^2$. A high-pressure mercury lamp is used for the ultraviolet exposure.

The peeling strength can be measured by the above-described method.

The tensile elastic modulus of the mask-integrated surface protective tape (the laminate formed by eliminating the release liner from the mask-integrated surface protective tape with a release liner) is preferably 1 GPa or more. If the tensile elastic modulus is 1 GPa or more, a warpage of the semiconductor wafer itself caused after the wafer thinning step can be suppressed, so that a handling error can be further reduced.

The tensile elastic modulus can be measured at a test speed of 300 mm/min in conformity to JIS K 7127.

The mask-integrated surface protective tape with a release liner according to the present invention can be used for a semiconductor wafer with a bump. Further, in the present invention by which an appropriate change of the above-described peeling strength is possible and a cured mask material layer can be adopted, a mask material layer can be formed of a soft material (material having a low storage elastic modulus) without impairing these acting functions. In this case, it is preferable for the mask-integrated surface protective tape with a release liner to have the following characteristics.

From the viewpoint of dealing with the semiconductor wafer with the bump, the thickness of the mask material layer 3b is preferably thicker than the height of the bump. Some semiconductor wafers with the bump have bumps with a maximum height of 250 µm, or further have a high bump density. By adjusting the storage elastic modulus to less than 100,000 Pa, the mask-integrated surface protective tape with a release liner can closely adhere to a patterned face thereby to prevent from intrusion of air and grinding water at the wafer thinning step, and further in plasma dicing, a mask material layer can be exposed on top while maintaining the surface condition thereof and used as a mask.

The wafer-fixing tape 4 is required to hold the semiconductor wafer 1 and to have resistance to plasma which is sustainable even if the wafer-fixing tape is subjected to the plasma dicing step. Further, in the picking-up step, a good picking-up property and also an expansion property and the like in some cases are required. Further, use may be made of any of known dicing tapes used in a conventional plasma dicing method, which are generally called as a dicing tape. Further, the use can be also made of a dicing die-bonding tape, in which an adhesion bond for die-bonding is laminated between the temporary-adhesive layer and the base film, in order to make it easy to transit to the dicing die-bonding step after picking-up.

For the laser irradiation with which the mask material layer 3b is cut, use can be made of a laser irradiator for irradiating an ultraviolet or infrared laser light. In this laser irradiator, a laser irradiation part capable of freely moving along the street of the semiconductor wafer 1 is arranged. Laser can be irradiated, which is provided with an output controlled suitably to remove the mask material layer 3b. In particular, if $CO_2$ laser is used as a laser light, it is possible to obtain a large power of several to tens of watts. $CO_2$ laser can be preferably used for the present invention.

In order to carry out the plasma dicing for wafer dicing and the plasma ashing for removal of mask material layer, use can be made of a usual plasma-etching apparatus. The plasma-etching apparatus is preferably an apparatus, which is capable of subjecting the semiconductor wafer 1 to dry etching, and in which a sealed treatment space is made in a vacuum chamber, to place the semiconductor wafer 1 on the side of the electrode for a high-frequency wave; a gas for plasma generation is supplied from the side of a gas-supplying electrode provided facing the electrode for high-frequency wave. If a high-frequency voltage is applied to the electrode for a high-frequency wave, plasma is generated between the gas-supplying electrode and the electrode for a high-frequency wave. Therefore, the resultant plasma is used. It is preferable to prevent a temperature elevation of the semiconductor wafer 1 due to the heat of this plasma, by circulating a refrigerant in a heat-producing electrode for high-frequency wave.

The mask-integrated surface protective tape with a release liner of the present invention has a mask-giving function in plasma dicing, so that a photolithography step and the like for providing a resist used in the conventional plasma dicing process becomes unnecessary. Further, the formation of the mask does not require a technique requiring a high degree of position alignment such as printing or transfer, and can be easily attached to the surface of a semiconductor wafer, so that the mask can be easily formed using a laser device.

Further, the mask material layer 3b can be removed with plasma ashing, and therefore removal of the mask portion can be carried out by the same apparatus as the plasma dicing apparatus. In addition, the plasma dicing is carried out from the patterned face 2 side (surface S side), and therefore it is not necessary to turn the chip upside down before the picking-up operation. From these reasons, the facilities can be simplified, and process costs can be considerably suppressed.

Further, a relationship of the peeling strength between each of layers is adjusted, so that the mask material layer can be exposed as the need arises, without an adhesive deposit, and this allows increase in operation efficiency.

Further, the mask-integrated surface protective tape with a release liner according to the present invention can be preferably used for production of the semiconductor chip using a semiconductor wafer with a bump. Furthermore, the mask material layer of the mask-integrated surface protective tape with a release liner according to the present invention can be constituted so as to follow well the patterned face containing a bump, so that a wafer thinning step can be carried out while suppressing cracking of the semiconductor wafer with a bump, deterioration of thickness accuracy of the semiconductor wafer, and the like.

Each of the above-described embodiments is an example of the present invention and therefore the present invention is not limited to these embodiments. Accordingly, addition, deletion, modification and the like of a known process may be made in each process to the extent of no departure from the scope of the present invention.

EXAMPLES

The present invention will be described in more detail based on examples given below, but the invention is not meant to be limited by these.

[Example 1] Production of Mask-Integrated Surface Protective Tape with Release Liner, and Production of Semiconductor Chip <Production of Mask-Integrated Surface Protective Tape with Release Liner>

The mask-integrated surface protective tape with a release liner shown in FIG. 1 was produced following the steps below.

1) Preparation of Temporary-Adhesive Composition A

A solution of (meth)acrylic polymer having a mass-average molecular weight of 700,000 was prepared by mixing 1.0% by mole of methacrylic acid, 78% by mole of 2-ethylhexyl acrylate and 21% by mole of 2-hydroxyethyl acrylate, and polymerizing the mixture in a solution.

To this (meth)acrylic polymer solution, with respect to 100 parts by mass of the polymer, 2.0 parts by mass of CORONATE L (isocyanate-based crosslinking agent, manufactured by Nippon Urethane Industry Co., Ltd.) as a crosslinking agent was blended, to obtain a temporary-adhesive composition A.

2) Preparation of Mask Material Composition A

A solution of (meth)acrylic polymer having a mass-average molecular weight of 700,000 was prepared by mixing 1.0% by mole of methacrylic acid, 78% by mole of 2-ethylhexyl acrylate and 21% by mole of 2-hydroxyethyl acrylate, and polymerizing the mixture in a solution.

To the (meth)acrylic polymer solution obtained, 2-methacryloyloxyethyl isocyanate (trade name: KARENZ MO I, manufacture by Showa Denko K.K.) was added and reacted with the (meth)acrylic polymer, to obtain a radiation-polymerizable (meth)acrylic polymer solution having the following physical properties. (Mass-average molecular weight: 700,000, double bond amount: 0.90 meq/g, hydroxyl group value: 33.5 mgKOH/g, acid value: 5.5 mgKOH/g, Tg: −68° C.)

To the radiation-polymerizable (meth)acrylic polymer solution obtained, with respect to 100 parts by mass of the polymer, 0.25 parts by mass of CORONATE L as a crosslinking agent and 5.0 parts by mass of IRGACURE 184 (product of BASF) were blended, to obtain a mask material composition A.

3) Preparation of Mask-Integrated Surface Protective Tape with Release Liner

The above-described temporary-adhesive composition A was coated on the release-treated surface of a release liner (trade name: E7006, thickness: 25 μm, manufactured by Toyobo Co., Ltd., having a release-treated surface on one side thereof) so that the thickness after drying was 30 μm, and then the temporary-adhesive layer formed was laminated on a LDPE (low density polyethylene) base film having a thickness of 100 μm, and then left to stand at room temperature (25° C.), to obtain a 155 μm-thick surface protective tape with a release liner.

The above-described temporary-adhesive layer formed is in the state where a (meth)acrylic polymer and a crosslinking agent have reacted.

Separately, the mask material composition A was coated on the release-treated surface of a release film (trade name: E7002, thickness: 25 μm, manufactured by Toyobo Co., Ltd., having a release-treated surface on one side thereof) so that the thickness after drying was 60 μm. The mask material layer obtained was laminated on the release-treated surface of a release liner (trade name: E7006, thickness: 25 μm, manufactured by Toyobo Co., Ltd., having a release-treated surface on one side thereof), and then left to stand at room temperature (25° C.), to obtain a 110 μm-thick monolithic material composed of the release liner, the mask material layer, and the release film. Meanwhile, with respect to the above-described release film, a corona treatment was applied in advance to the surface which has not subjected to a release treatment.

The above-described mask material layer formed is in the state where a radiation-polymerizable (meth)acrylic polymer and the crosslinking agent have reacted, and is in the state where curing by radiation exposure has not been occurred.

After that, a 240 μm-total thick mask-integrated surface protective tape with a release liner was obtained by peeling the release liner of the surface protective tape with a release liner, and then laminating the temporary-adhesive layer on the corona-treated surface of the release film of the monolithic material composed of the release liner, the mask material layer and the release film.

<Production of Semiconductor Chip>

A mask-integrated surface protective tape made by peeling only the release liner from the mask-integrated surface protective tape with a release liner obtained in the above was laminated on the surface of a silicon wafer with a scribe line (street) (diameter: 8 inches, thickness: 350 μm) using a laminator DR8500III (trade name, manufactured by Nitto Seiki Co., Ltd.). Herein, judging from the fact that only the release liner had been peeled leaving the mask material layer, it was confirmed that the peeling strength between the release film and the mask material layer and the peeling strength between the release liner and the mask material layer satisfy the predetermined relationship of the peeling strength.

After that, a surface (backing-face of the silicon wafer) on a side opposite to the side on which the above-described mask-integrated surface protective tape was laminated was ground until the thickness of the silicon wafer got to 50 μm using a full automatic grinder/polisher DGP-8760 (trade name, manufactured by DISCO Inc.). The silicon wafer after grinding was mounted on a dicing tape from the silicon wafer back side using a wafer mounter RAD-2700F (trade name, manufactured by Lintec Corporation) and was supported and fixed with a ring frame. Further, by ultraviolet exposure of 500 mJ/$cm^2$ from the mask-integrated tape side using a high-pressure mercury lamp, the peeling strength between the mask material layer and the release film was reduced and the laminate composed of the base film, the temporary-adhesive layer and the release film was peeled leaving the cured mask material layer on the silicon wafer. Herein, judging from the fact that only the laminate of the base film, the temporary-adhesive layer and the release film had been peeled leaving the cured mask material layer, it was confirmed that after ultraviolet exposure, the peeling strength between the mask material layer and the release film and the peeling strength between the mask material layer and the wafer satisfy a predetermined relationship of the peeling strength.

Next, the mask material on the scribe line was removed by a $CO_2$ laser to form an opening on the scribe line.

After that, the silicon wafer was subjected to a plasma irradiation with a $SF_6$ gas as a plasma-generating gas from the mask material layer side at an etching rate of 15 μm/min for 5 minutes. By this plasma dicing, the silicon wafer was cut and divided into individual chips. Next, the chips were subjected to ashing with an $O_2$ gas as a plasma-generating gas at an etching rate of 1.5 μm/min for 10 minutes thereby to remove the mask material. After that, an ultraviolet ray was irradiated (irradiation dose: 200 mJ/$cm^2$) from the dicing tape side thereby to decrease an adhesive force of the dicing tape, and chips were picked up.

[Example 2] Production of Mask-Integrated Surface Protective Tape with Release Liner, and Production of Semiconductor Chip A mask-integrated surface protective tape with a release liner for Example 2 was obtained by the same manner as in Example 1, except that, in the preparation of the mask-integrated surface protective tape with a release liner for Example 1, the release film was replaced with another release film (trade name: E7004, thickness: 25 µm, manufactured by Toyobo Co., Ltd., having a release-treated surface on one side thereof).

The production of the semiconductor chip was carried out by the same manner as in Example 1, except for using the forgoing mask-integrated surface protective tape with a release liner.

[Comparative Example 1] Mask Formation by Photolithography Process, Preparation of Surface Protective Tape, and Production of Semiconductor Chip <Preparation of Wafer with Mask>

A 8-inch silicon wafer (thickness: 350 µm) having a chip size of 10 mm×10 mm and having thereon scribe lines with a scribe line width of 70 µm was prepared using a laser. On the prepared wafer having scribe lines, a positive-working light-sensitive material was coated to form a 10 µm-thick resist mask layer. An ultraviolet irradiation was conducted only on the scribe lines using a photomask and then the resist on the scribe lines was removed with an alkaline developer to prepare a wafer with a mask.

<Preparation of Pressure-Sensitive Surface Protective Tape with Release Liner>

To 100 parts by mass of KP-1909B (trade name, manufactured by Nippon Carbide Industries Co., Inc.), 0.5 mass parts of CORONATE L (trade name, manufactured by Nippon Polyurethane Industry Co., Ltd.) as a crosslinking agent was blended, to obtain a temporary-adhesive composition.

This temporary-adhesive composition was coated on a peeling liner so as to be a thickness of 30 µm, and then was laminated on a corona-treated surface of the 100 µm-thick LDPE (low density polyethylene) film to obtain a 130 µm-thick pressure-sensitive surface protective tape with a peeling liner.

<Production of Semiconductor Chip>

Using a laminator DR8500 µl (trade name, manufactured by Nitto Seiki Co., Ltd.), a pressure-sensitive surface protective tape made by peeling the release liner from the mask-integrated surface protective tape with a release liner prepared in the above was laminated on the mask of the silicon wafer with a mask prepared in the above.

After that, the backing-face of the above-described silicon wafer with a mask was ground using DGP8760 (trade name, manufactured by DISCO Corporation) until a thickness of the wafer got to 50 µm. The ground silicon wafer with a mask material was mounted on a dicing tape from the wafer backing-face side using RAD-2700F (trade name, manufactured by Lintec Corporation), and was supported and fixed to a ring flame. After that, the pressure-sensitive surface protective tape was peeled.

After that, the wafer was divided into chips by the plasma dicing in the same manner as in Example 1. Next, the mask was removed by ashing in the same manner as in Example 1, and further the chips were picked up in the same manner as in Example 1.

[Test Example 1] Peelability of Release Liner

In <Production of semiconductor chip> of each of the above-described Examples, strength (peelability) needed in peeling a release liner was evaluated according to the following criteria. Meanwhile, the peeling of the release liner was carried out at a peeling angle of 90° and a peeling speed of 50 mm/min under the conditions of 23° C. and 50% RH to measure the peeling strength. Further, the peeling strength between the release film and the mask material layer was also measured in the same manner as the above. The results are shown in the following Table 1.

TABLE 1

| | Example 1 | Example 2 | Comparative Example 1 |
|---|---|---|---|
| Peeling strength between release liner and mask material layer ($P_2$) (N/25 mm) | 0.02 | 0.02 | — |
| Peeling strength between release film and mask material layer ($P_1$) (N/25 mm) | 0.05 | 0.10 | — |

In the above test, because only the release liner could be peeled without damaging a mask material layer, this result is indicated as "o" in Table 2.

[Test Example 2] Peelability Evaluation of Laminate Composed of Base Film, Temporary-Adhesive Layer and Release Film In <Production of semiconductor chip> of each of the above-described Examples and Comparative Example, peelability was evaluated based on whether the laminate composed of the base film, the temporary-adhesive layer and the release film, or the pressure-sensitive surface protective tape could be peeled. Meanwhile, the peeling of the laminate composed of the base film, the temporary-adhesive layer and the release film, or the pressure-sensitive surface protective tape was carried out using RAD-2700F (trade name, manufactured by Lintec Corporation). The results are shown in the following Table 2.

—Criteria for Peelability Evaluation of Laminate Composed of Base Film, Temporary-Adhesive Layer and Release Film— o: The laminate composed of the base film, the temporary-adhesive layer and the release film, or the pressure-sensitive surface protective tape could be peeled.

x: The laminate composed of the temporary-adhesive layer and the release film, or the pressure-sensitive surface protective tape could not be peeled. Alternatively, a part of the mask material layer was peeled.

[Test Example 3] Removal Property Evaluation of Mask Material Layer by $O_2$ Plasma Ashing In the <Production of semiconductor chip> in each of the above-described Examples and Comparative Examples, the presence or absence of a residual of the mask material after $O_2$ plasma ashing (ashing for 10 minutes at the etching rate of 1.5 µm/min) was checked using a laser microscope. The results are shown in the following Table 2.

—Criterion for Removal Property Evaluation of Mask Material Layer—
  ○: A residue of the mask material layer was non-existent.
  x: A residue of the mask material layer was existent.

[Test Example 4] Environmental Load

Acid solutions and alkaline solutions make a waste liquid treatment cumbersome, and a heavy environmental load is imposed thereon. Investigation whether acid solutions and alkaline solutions are used in the processing step was conducted. The results are shown in the following Table 2.
—Criterion for Environmental Load Evaluation—
  ○: Neither acid solutions nor alkaline solutions are used.
  x: Acid solutions and alkaline solutions are used.

[Test Example 5] Workload (Comprehensive Evaluation)

Further, on the basis of evaluation results in the above-described Test Examples 2 to 4, workload was comprehensively evaluated according to the following evaluation criteria. The results are shown in the following Table 2.

Criterion for Workload Evaluation

○: Pass in all Test Examples 2 to 4
x: Fail in any one of Test Examples 2 to 4

TABLE 2

|  | Example 1 | Example 2 | Comparative Example 1 |
|---|---|---|---|
| Test Example 1: Peelability of release liner | ○ | ○ | — |
| Test Example 2: Peelability of laminate composed of base film, temporary-adhesive layer and release film | ○ | ○ | x |
| Test Example 3: Removal property of mask material layer | ○ | ○ | x |
| Test Example 4: Environmental load | ○ | ○ | x |
| Test Example 5: Workload | ○ | ○ | x |

According to the mask-integrated surface protective tape with a release liner of the present invention, a mask-integrated surface protective tape can be made by peeling the release liner therefrom. Further, as described above, after laminating it on the semiconductor wafer, a mask material layer could be exposed on top of the semiconductor wafer while maintaining the surface condition of the mask material layer.

Further, from the results in each of the above-described Test Examples, it was confirmed that, in processing semiconductor wafers thereby to produce a semiconductor chips, a mask could be formed easily without adhesive deposit by using the mask-integrated surface protective tape with a release liner according to the present invention, and by laminating the mask-integrated surface protective tape on a patterned face of the semiconductor wafer, and by peeling only a laminate composed of a base film, a temporary-adhesive layer and a release film from the tape, and further the mask could be removed certainly by $O_2$ plasma, whereby environmental load and workload could be reduced.

Having described our invention as related to the present embodiments, it is our intention that the invention not be limited by any of the details of the description, unless otherwise specified, but rather be construed broadly within its spirit and scope as set out in the accompanying claims.

This application claims priority on Patent Application No. 2017-071253 filed in Japan on Mar. 31, 2017, which is entirely herein incorporated by reference.

REFERENCE SIGNS LIST

101 Mask-integrated surface protective tape with release liner
1 Semiconductor wafer
2 Patterned face
3 Mask-integrated surface protective tape
  3a Laminate composed base film, temporary-adhesive layer, and release film
    3aa Base film
    3ab Temporary-adhesive layer
    3ac Release film
  3b Mask material layer
  3c Release liner
4 Wafer fixing tape
7 Chip
S Surface
B Backing-face
M1 Wafer-grinding apparatus
M2 Pin
M3 Collet
F Ring flame
L Laser ($CO_2$ laser)
P1 Plasma of $SF_6$ gas
P2 Plasma of $O_2$ gas

The invention claimed is:

1. A mask-integrated surface protective tape with a release liner, comprising, in the following order:
  a base film,
  a temporary-adhesive layer,
  a release film,
  a mask material layer, and
  a release liner,
  wherein the release film and the release liner each have one release-treated surface, and the release-treated surfaces of the release film and the release liner each are in contact with the mask material layer,
  wherein the peeling strength between the release liner and the mask material layer is smaller than the peeling strength between the release film and the mask material layer,
  wherein
  the base film comprises a plastic,
  the temporary-adhesive layer contains an acrylic temporary-adhesive, and
  the mask material layer contains: an acrylic temporary-adhesive; a temporary-adhesive comprising an acrylic temporary-adhesive and a radiation-polymerizable compound; or a radiation-curable temporary adhesive containing a radiation-polymerizable (meth)acrylic polymer.

2. The mask-integrated surface protective tape with a release liner according to claim 1, wherein the storage elastic modulus of the mask material layer is less than 100,000 Pa.

3. The mask-integrated surface protective tape with a release liner according to claim 1, wherein the peeling strength between the release film and the mask material layer is 0.02 N/25 mm or more and less than 1.0 N/25 mm.

4. The mask-integrated surface protective tape with a release liner according to claim 1, wherein the tensile elastic modulus of a laminate obtained by removing the release liner from the mask-integrated surface protective tape with a release liner, is 1 GPa or more.

5. The mask-integrated surface protective tape with a release liner according to claim 1, wherein the tensile elastic modulus of the release film is 1.5 GPa or more.

6. The mask-integrated surface protective tape with a release liner according to claim 1, wherein the thickness of the release film is from 25 μm to 75 μm.

7. The mask-integrated surface protective tape with a release liner according to claim 1, wherein the plastic is a low-density polyethylene or an ethylene-vinyl acetate copolymer.

8. The mask-integrated surface protective tape with a release liner according to claim 1, wherein the mask material layer is ultraviolet-curable.

9. The mask-integrated surface protective tape with a release liner according to claim 1, which is for use in a production of a semiconductor chip including the following steps (a) to (d):
   (a) a step of peeling the release liner from the mask-integrated surface protective tape with the release liner, to form a mask-integrated surface protective tape, and then in the state where the mask-integrated surface protective tape has been laminated on a patterned face of a semiconductor wafer, grinding a backing-face of the semiconductor wafer, and then laminating a wafer-fixing tape on the backing-face of the ground semiconductor wafer, and then supporting and fixing the semiconductor wafer with a ring flame;
   (b) a step of peeling together the base film, the temporary-adhesive layer and the release film from the mask-integrated surface protective tape, thereby to expose the mask material layer on top, and then cutting a portion of the mask material layer corresponding to a street of the semiconductor wafer by a laser, thereby to open the street of the semiconductor wafer;
   (c) a plasma-dicing step of segmentalizing the semiconductor wafer on the street by a $SF_6$ plasma, and thereby for singulating the semiconductor wafer into semiconductor chips; and
   (d) an ashing step of removing the mask material layer by an $O_2$ plasma.

10. The mask-integrated surface protective tape with a release liner according to claim 9, wherein the thickness of the mask material layer is larger than a maximum height of the asperity of the patterned face.

11. The mask-integrated surface protective tape with a release liner according to claim 9, wherein the maximum height of the asperity of the patterned face is 50 μm or more.

* * * * *